United States Patent [19]
Maekawa

[11] Patent Number: 5,894,296
[45] Date of Patent: Apr. 13, 1999

[54] BIDIRECTIONAL SIGNAL TRANSMISSION NETWORK AND BIDIRECTIONAL SIGNAL TRANSFER SHIFT REGISTER

[75] Inventor: Toshikazu Maekawa, Kanagawa, Japan

[73] Assignee: Sony Corporation, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/923,450

[22] Filed: Sep. 4, 1997

Related U.S. Application Data

[63] Continuation of application No. 08/264,483, Jun. 23, 1994, abandoned.

[30] Foreign Application Priority Data

Jun. 25, 1993 [JP] Japan .................. 5-180787

[51] Int. Cl.$^6$ ............................. G09G 3/36
[52] U.S. Cl. ........................... 345/98; 345/100
[58] Field of Search ..................... 345/211, 197, 345/198, 104, 100, 98, 87, 88, 89, 99, 55, 56

[56] References Cited

U.S. PATENT DOCUMENTS

| | | | |
|---|---|---|---|
| 2,998,192 | 8/1961 | Florida | 377/69 |
| 3,975,717 | 8/1976 | Panigrahi | 377/58 |
| 4,326,201 | 4/1982 | Enokizono | 345/197 |
| 4,931,787 | 6/1990 | Shannon | 345/100 |
| 5,191,450 | 3/1993 | Yajima et al. | 345/88 |
| 5,282,234 | 1/1994 | Murayama et al. | 345/87 |
| 5,682,175 | 10/1997 | Kitamura | 345/100 |

FOREIGN PATENT DOCUMENTS 0 391 654  10/1990  European Pat. Off.

OTHER PUBLICATIONS

Japanese Abstract, vol. 18, No. 149 (P–1708), JP 5323903, Jul. 12, 1993.
Japanese Abstract, vol. 15, No. 116 (P–1182), JP 3005998, Nov. 1, 1991.
U. Tietze et al., "Halbleiter–Schaltungstechnik", Springer–Verlag Berlin, 1974, pp. 550–555.

Primary Examiner—Xiao Wu
Attorney, Agent, or Firm—Hill & Simpson

[57] ABSTRACT

A bidirectional signal transfer shift register with a simple circuit construction is disclosed together with suitable applications of the same. The bidirectional signal transfer shift register comprises a plurality of flipflops each having an input terminal and an output terminal in pair. The input and output terminals of the flipflops are connected successively in such a manner as to construct a multi-stage structure. A forward route gate element is interposed in a connection route between the output terminal of the front stage side one of each two adjacent front and rear ones of the flipflops and the input terminal of the rear stage side flipflop, and a reverse route gate element is interposed in another connection route between the output terminal of the rear stage side flipflop and the input terminal of the front stage side flipflop. Forward direction signal transmission processing and reverse direction signal transmission processing can be switchably selected by alternatively controlling the forward and reverse route gate elements to open or close.

8 Claims, 7 Drawing Sheets

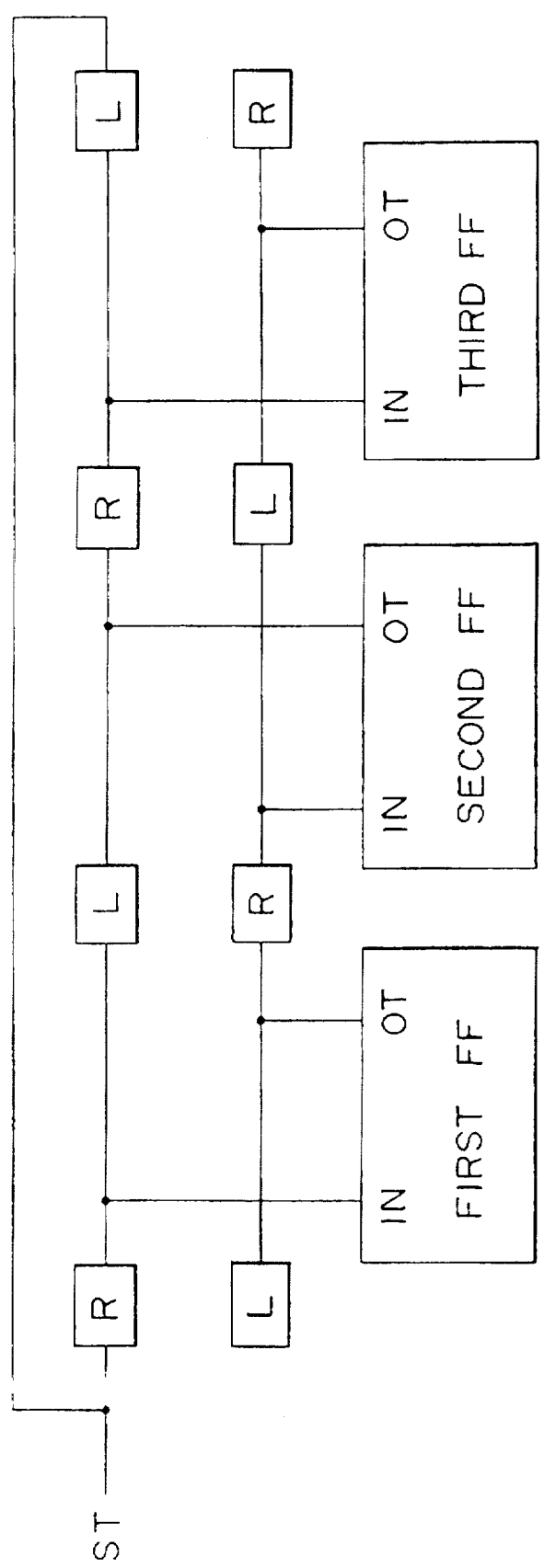

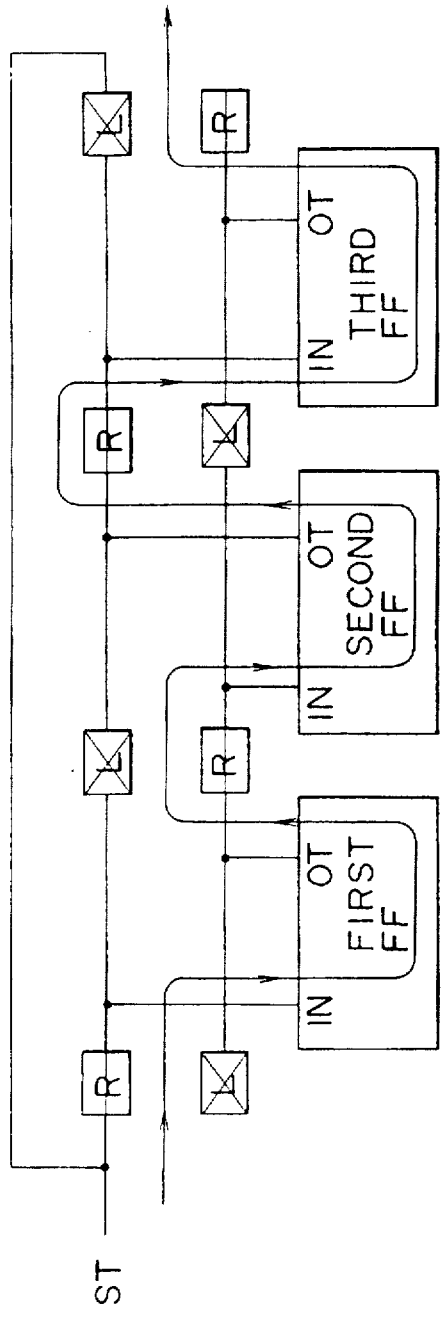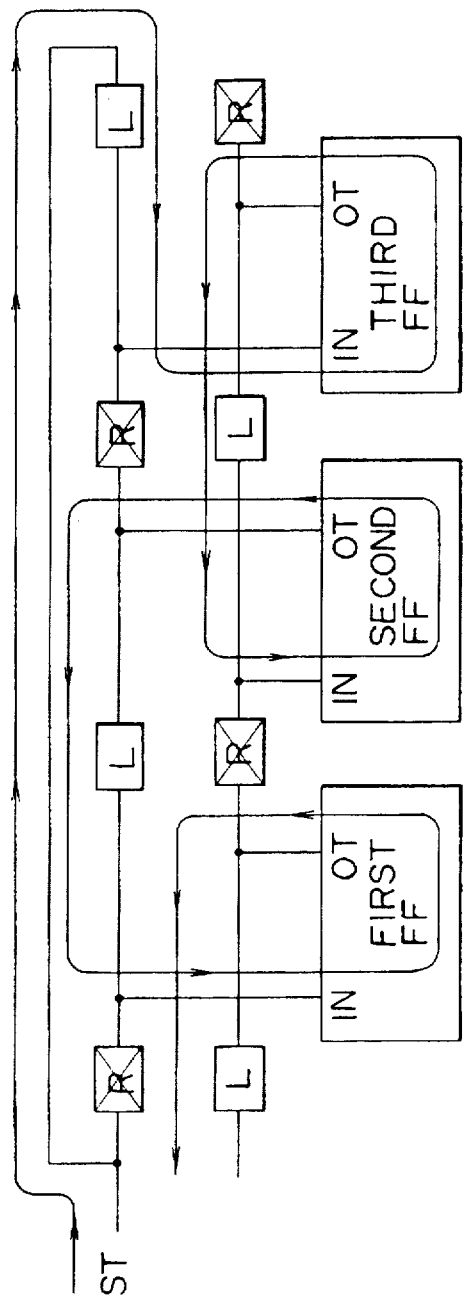
F I G. 2(A)
F I G. 2(B)

of an image. a drive circuit of an active matrix liquid crystal display device and used for reversal display of an image.
BIDIRECTIONAL SIGNAL TRANSMISSION NETWORK AND BIDIRECTIONAL SIGNAL TRANSFER SHIFT REGISTER This is a continuation of application Ser. No. 08/264,483, filed Jun. 23, 1994, now abandoned.

BACKGROUND OF THE INVENTION

1. Field of the Invention

This invention relates generally to a bidirectional signal transmission network and more particularly to a bidirectional signal transfer shift register which is suitably incorporated, for example, in a drive circuit of an active matrix liquid crystal display device and used for reversal display of an image.

2. Description of the Related Art

An active matrix liquid crystal display device is conventionally known and has such a a general construction as shown in FIG. 6. Referring to FIG. 6, the active matrix liquid crystal display device (LCD) 100 shown includes a liquid crystal layer 101 which exhibits a predetermined electro-optical effect and is held between a pair of transparent glass substrates 102 and 103. A plurality of picture element electrodes 104 are formed on an inner surface of the substrate 102 and disposed in a matrix. A thin film transistor 105 made of polycrystalline silicon or a like material is connected to each of the individual picture element electrodes 104. The drain electrodes of the thin film transistors 105 are connected to the corresponding picture element electrodes 104; the source electrodes are connected to corresponding data lines 106; and the gate electrodes are connected to corresponding gate lines 107. A plurality of opposing electrodes 108 are formed on an entire inner surface of the other substrate 103. An image data signal is written by way of the individual thin film transistors 105 into the corresponding picture element electrodes 104. Electro-optical variations of the liquid crystal layer 101 caused by the image data signal are detected as transmission light amount variations by means of, for example, a pair of polarization plates (not shown) to effect display of a desired image.

An active matrix liquid crystal display device having the construction described above can be utilized, for example, as a light valve for a liquid crystal projector. A liquid crystal projector includes three liquid crystal display devices to which the three primary colors are allocated, and a common enlarging projection lens system. The liquid crystal display devices function as light valves for the different color systems of red, green and blue. The liquid crystal display devices resolve a primary image into red, green and blue components and display them. Red, green and blue illumination light beams are introduced simultaneously into the liquid crystal display devices. Single color transmission light images of the individual liquid crystal display devices are composed by means of a dichroic prism or a dichroic mirror, and a thus composed full color image is projected in an enlarged scale onto a screen by the projection lens system. In the optical system of the liquid crystal projector, a primary image is composed after reflection reversal is repeated several times. Depending upon the arrangement structure of the optical system, the number of times of reflection reversal is different among the different color systems. Accordingly, in order to obtain an aligned full color image, a primary image component of a predetermined color must be displayed reversely in advance. Or, depending upon installation environments of the liquid crystal projector, it may possibly be mounted in an inverted posture on a ceiling to effect projection. Also in this instance, a primary image to be displayed on the liquid crystal display device must be reversed in advance.

In this manner, a structure which can suitably select reversal display depending upon an object of use or an application of the liquid crystal display device is conventionally demanded. To this end, various image reversing systems have been proposed conventionally. For example, such a system as shown in FIG. 7 which makes use of image signal processing is known. Referring to FIG. 7, an original image data signal SIG is inputted once to an analog to digital (A/D) conversion and reversal processing circuit 110, in which it is converted into a digital signal and then processed by reversal processing. For example, the data signal is successively written into a frame memory and then read out in the reverse direction. The data signal processed by the reversal processing is supplied to a liquid crystal display device 100 by way of a buffer 111.

FIG. 8 shows another system for image reversal. Referring to FIG. 8, a downward scanning circuit 120 is connected to gate lines 107 of a liquid crystal display device 100. An ordinary unidirectional shift register not shown is incorporated in the downward scanning circuit 120 and sends out a gate signal to the gate lines 107 successively beginning with the upper end and ending with the lower end of the screen. Also an upward scanning circuit 121 is connected to other gate lines 107. A unidirectional shift register not shown is incorporated also in the upward scanning circuit 121 and sends out a gate signal to the gate lines 107 successively beginning with the lower end to the upper end of the screen. The downward scanning circuit 120 and the upward scanning circuit 121 in pair can be selected suitably. When the downward scanning circuit 120 is selected, a normal or non-reversed image is displayed, but when the upward scanning circuit 121 is selected, a vertically reversed image is displayed. Similarly, a rightward scanning circuit 122 and a leftward scanning circuit 123 in pair are connected to data lines 106. When the rightward scanning circuit 122 is selected, normal image display is performed, but when the leftward scanning circuit 123 is selected, a leftwardly and rightwardly reversed image is displayed. It is to be noted that, while the four scanning circuits are shown disposed outside the liquid crystal display device 100 in FIG. 8, it is possible to actually form them in an integrated condition in the inside of the liquid crystal display device 100.

In the reversing system shown in FIG. 7 which makes use of image signal processing, since the A/D reversal processing circuit and so forth have a large scale, there is a problem to be solved in that the power dissipation is high and reduction in size is obstructed, resulting in disadvantage in terms of the cost. Meanwhile, with the reversing circuit structure shown in FIG. 8, there is another subject to be solved in that, since four scanning circuits are required, where they are formed in the inside of a liquid crystal display device, the device requires a large area and the yield is deteriorated as much.

SUMMARY OF THE INVENTION

It is an object of the present invention to provide a reversing system for an active matrix liquid crystal display device which is simple in structure and inexpensive.

It is another object of the present invention to provide a bidirectional shift register which is suitable to drive an active matrix liquid crystal device to display a reversed image.

It is a further object of the present invention to provide a two-dimensional address device which can reverse the scanning direction.

It is an additional object of the present invention to provide a bidirectional signal transmission network which can transmit a signal in the opposite directions with a simple construction.

In order to achieve the objects described above, according to an aspect of the present invention, there is provided a bidirectional signal transfer shift register, which comprises a plurality of flipflops each having an input terminal and an output terminal in pair, the input and output terminals of the flipflops being connected successively in such a manner as to construct a multi-stage structure, a forward route gate element interposed in a connection route between the output terminal of the front stage side one of each two adjacent front and rear ones of the flipflops and the input terminal of the rear stage side flipflop, and a reverse route gate element interposed in another connection route between the output terminal of the rear stage side one of each two adjacent front and rear ones of the flipflops and the input terminal of the front stage side flipflop.

The bidirectional signal transfer shift register having the construction can be applied, for example, to an active matrix liquid crystal display device. In particular, according to another aspect of the present invention, there is provided an active matrix liquid crystal display device, which comprises a first substrate on which a plurality of gate lines disposed along the direction of a row of a matrix, a plurality of data lines disposed along the direction of a column of the matrix, a plurality of active elements positioned at crossing points between the gate lines and the data lines, a plurality of picture element electrodes individually driven by the active elements, a vertical drive circuit for supplying a gate signal line-sequentially to the gate lines, and a horizontal drive circuit for supplying a data signal line-sequentially to the data lines are formed, a second substrate disposed in an opposing relationship to the first substrate and having a plurality of opposing electrodes formed thereon, a liquid crystal layer held in a gap between the first and second substrates, and a bidirectional shift register capable of switchably controlling the line sequential supplying order of the gate signal or the data signal between two forward and reverse directions. The bidirectional shift register may be included in the vertical drive circuit so as to selectively allow vertically reversed display of an image or alternatively included in the horizontal drive circuit so as to selectively allow leftwardly and rightwardly reversed display of an image.

The present invention can be applied not only to a bidirectional signal transfer shift register but also widely to bidirectional signal transmission networks. In particular, according to a further aspect of the present invention, there is provided a bidirectional signal transmission network, which comprises a plurality of signal transmission blocks each having an input terminal of a comparatively high impedance and an output terminal of a comparatively low impedance, the input and output terminals of the signal transmission blocks being connected successively, a forward route gate element interposed in a connection route between the output terminal of the front stage side one of each two adjacent front and rear ones of the signal transmission blocks and the input terminal of the rear stage side signal transmission block, a reverse route gate element interposed in another connection route between the output terminal of the rear stage side one of each two adjacent front and rear ones of the signal transmission blocks and the input terminal of the front stage side signal transmission block, and control means for alternatively controlling the forward route gate elements and the reverse route gate elements to open or close to switchably select forward direction signal transmission processing from the front stage side signal transmission blocks to the rear stage side signal transmission blocks and reverse direction signal transmission processing from the rear stage side signal transmission blocks to the front stage side signal transmission blocks.

The bidirectional signal transmission network having the construction can be applied, for example, to a drive circuit for a two-dimensional address device. In particular, according to a still further aspect of the present invention, there is provided a two-dimensional address device which includes a row scanning line group, a column scanning line group, and a group of active elements disposed corresponding to individual crossing points between the two scanning line groups, comprising a drive circuit connected to at least one of the scanning line groups for successively supplying a drive signal to the scanning line group, the drive circuit including a plurality of signal transmission blocks each having an input terminal and an output terminal, the input and output terminals of the signal transmission blocks being connected successively, the output terminals of the signal transmission blocks being individually connected to corresponding scanning lines of the one scanning line group, a forward route gate element interposed in a connection route between the output terminal of the front stage side one of each two adjacent front and rear ones of the signal transmission blocks and the input terminal of the rear stage side signal transmission block, and a reverse route gate element interposed in another connection route between the output terminal of the rear stage side one of each two adjacent front and rear ones of the signal transmission blocks and the input terminal of the front stage side signal transmission block, whereby the forward route gate elements and the reverse route gate elements are alternatively controlled to open or close to switchably select forward direction signal transmission processing from the front stage side signal transmission blocks to the rear stage side signal transmission blocks and reverse direction signal transmission processing from the rear stage side signal transmission blocks to the front stage side signal transmission blocks.

According to the present invention, the bidirectional signal transmission network is realized with the simple structure that a forward route gate element is interposed in a connection route between the output terminal of the front stage side one of each two adjacent front and rear ones of signal transmission blocks and the input terminal of the rear stage side signal transmission block and a reverse route gate element is interposed in another connection route between the output terminal of the rear stage side one of each two adjacent front and rear ones of the signal transmission blocks and the input terminal of the front stage side signal transmission block. By alternatively controlling the forward route gate elements and the reverse route gate elements to open or close, forward direction signal transmission processing and reverse direction signal transmission processing can be switchably selected. For example, by connecting flipflops as the signal transmission blocks in multiple stages, a bidirectional signal transfer shift register can be obtained readily. By incorporating the bidirectional signal transfer shift register into a drive circuit for an active matrix liquid crystal display device, selective reversed display of an image can be realized readily. Further, by incorporating the bidirectional signal transmission network into a drive circuit for a two-dimensional address device, bidirectional two-dimensional addressing can be achieved readily.

The above and other objects, features and advantages of the present invention will become apparent from the fol-

BRIEF DESCRIPTION OF THE DRAWINGS

FIG. 1 is a block diagram showing a basic construction of a bidirectional signal transfer shift register according to the present invention;

FIGS. 2(A) and 2(B) are block diagrams illustrating different operations of the bidirectional signal transfer shift register shown in FIG. 1;

DESCRIPTION OF THE PREFERRED EMBODIMENTS

Figure 3:
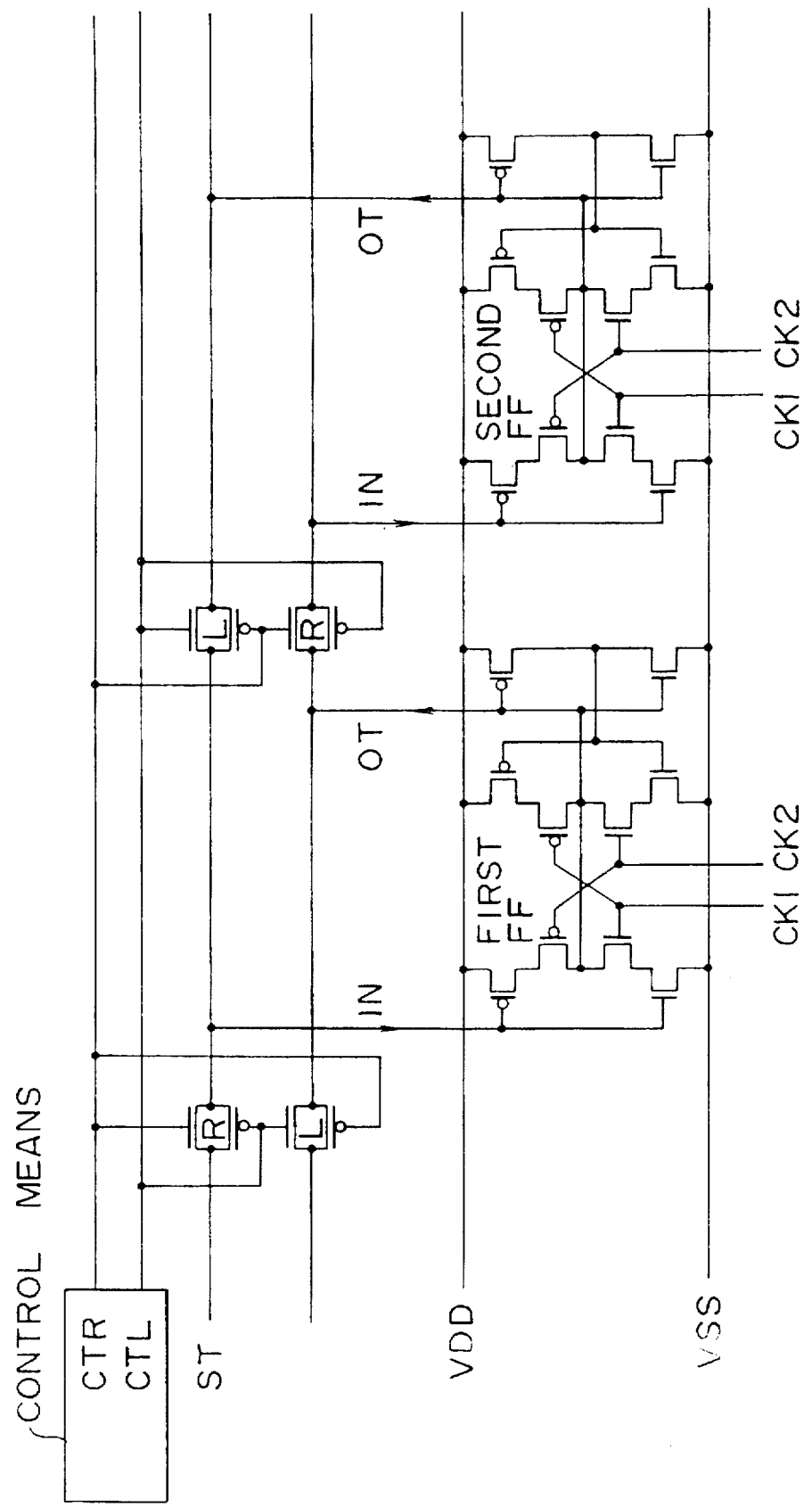
FIG. 3 is a circuit diagram showing a detailed construction of the bidirectional signal transfer shift register shown in FIG. 1.

Referring first to FIG. 1, there is shown a basic construction of a bidirectional signal transfer shift register according to the present invention. The present shift register has a multi-stage structure which includes a plurality of flipflops FF each including an input terminal IN and an output terminal OT in pair and wherein the input and output terminals of the flipflops FF are connected successively. It is to be noted that, in the arrangement shown in FIG. 1, the flipflops FF have a multi-stage connection of three stages of the first to third stages in order to facilitate understanding. When an actual application is intended, there is no special limitation in such number of stages. A forward route gate element R is interposed in a connection line between the front stage side output terminal and the rear stage side input terminal of each adjacent front and rear ones of the flipflops FF while a reverse route gate element L is interposed in another connection line between the rear stage side output terminal and the front stage side input terminal. For example, if it is assumed that, in the multi-stage connection shown, the front stage side flipflop is the first flipflop FF and the rear stage side is the second flipflop FF, then a forward route gate element R is interposed in the connection route between the output terminal OT of the first flipflop FF and the input terminal IN of the second flipflop FF. Meanwhile, a reverse route gate element L is interposed in the connection route between the output terminal OT of the second flipflop FF and the input terminal IN of the first flipflop FF. By alternatively controlling the forward route gate elements R and the reverse route gate elements L to open or close, forward direction signal transfer from the front stage side to the rear stage side (signal transfer from the left side to the right side in FIG. 1) and reverse direction signal transfer from the rear stage side to the front stage side (signal transfer from the right side to the left side in FIG. 1) can be switchably selected.

Operation of the bidirectional signal transfer shift register shown in FIG. 1 will be described in detail with reference to FIGS. 2(A) and 2(B). FIG. 2(A) illustrates forward direction signal transfer. In the forward direction signal transfer, the forward route gate elements R are open which the reverse route gate elements L are closed. Consequently, a start signal ST first passes the first forward route gate element R and is then supplied to the input terminal IN of the first flipflop FF as indicated by an arrow mark. The first flipflop FF processes the start signal ST in synchronism with a clock signal and supplies the thus process signal to the output terminal OT thereof. The output signal is supplied to the input terminal IN of the second flipflop FF by way of the next forward route gate element R. Similarly, the second flipflop FF executes internal processing of the signal transferred thereto and then supplies the thus processed signal to the output sterminal OT thereof. The output signal is transferred to the input terminal IN of the third flipflop FF by way of the next forward route gate element R. Finally, the output signal of the third flipflop FF is transmitted to the last forward route gate element R.

FIG. 2(B) illustrates reverse direction signal transfer. In the reverse direction signal transfer, the reverse route gate elements L are open while the forward route gate elements R are closed. The start signal ST cannot be supplied to the input terminal IN of the first flipflop FF since the first forward route gate element R is closed. Instead, the start signal ST passes the last reverse route gate element L by way of a bypass route so that it is supplied to the input terminal IN of the third flipflop FF. The transfer signal is processed by internal processing by the third flipflop FF and then supplied from the output terminal OT of the third flipflop FF to the input terminal IN of the second flipflop FF by way of the next reverse route gate element L. After the transfer signal is processed by internal processing by the second flipflop FF, it is supplied from the output terminal OT of the second flipflop FF to the input terminal IN of the first flipflop FF by way of the next reverse route gate element L. The transfer signal processed by internal processing by the first flipflop FF is then transmitted from the output terminal OT of the first flipflop FF to the top reverse route gate element L.

FIG. 3 shows an exemplary detailed circuit construction of the bidirectional signal transfer shift register shown in FIG. 1. In order to simplify the illustration, only the first flipflop FF, the second flipflop FF, and forward route gate elements R and reverse route gate elements L associated with them are shown. In the arrangement shown, all circuit elements are constituted from thin film transistors (TFTs). However, the circuit elements may alternatively be bipolar transistors or MOS transistors. The first flipflop FF and the second flipflop FF are both constituted from D-type flipflops and make signal transmission blocks of the clock controlled type. The D-type flipflops are each constituted from first and second clock invertors and a third invertor and operate in response to clock signals CK1 and CK2 of opposite phases to each other to delay a signal inputted thereto from the input terminal IN by a half period of the clock signals and output the delayed signal to the output terminal OT. Each of the forward route gate elements R is constituted from a transmission gate element of the CMOS type, and also each of the reverse route gate elements L is similarly constituted from a transmission gate element. It is to be noted that analog switches only of the NMOS or PMOS type may alternatively be utilized as the gate elements. The forward route gate elements R and reverse route gate elements L are controlled by control signals CTR and CTL of opposite phases to each other supplied thereto from control means. When the control signal CTR is at a high level and the other control signal CTL is at a low level, the forward route gate elements R are opened while the reverse route gate elements L are closed. Accordingly, in this instance, the start signal ST first passes the first forward route gate element R and is then supplied to the input terminal IN of the first flipflop FF. After the start signal ST is processed by delaying processing by a half period of the clock signals by the first flipflop FF, it is transferred from the output terminal OT of the first flipflop FF to the input terminal IN of the second flipflop FF by way of the next forward route gate element R. The start signal ST is transferred successively in the forward direction in this manner. On the other hand, when the control signal CTR is changed over to a low level and the control signal CTL is changed over to a high level, the forward route gate elements R are closed while the reverse route gate elements L are opened. In this instance, a signal having been transferred in the reverse direction is supplied to the input terminal IN of the second flipflop FF and processed by predetermined delaying processing by the second flipflop FF, and then it is transferred from the output terminal OT of the second flipflop FF to the input terminal IN of the first flipflop FF by way of the associated reverse route gate element L. After the transfer signal is processed by predetermined delaying processing by the first flipflop FF, it is outputted from the output terminal OT of the first flipflop FF and received by the next reverse route gate element L.

Figure 4:
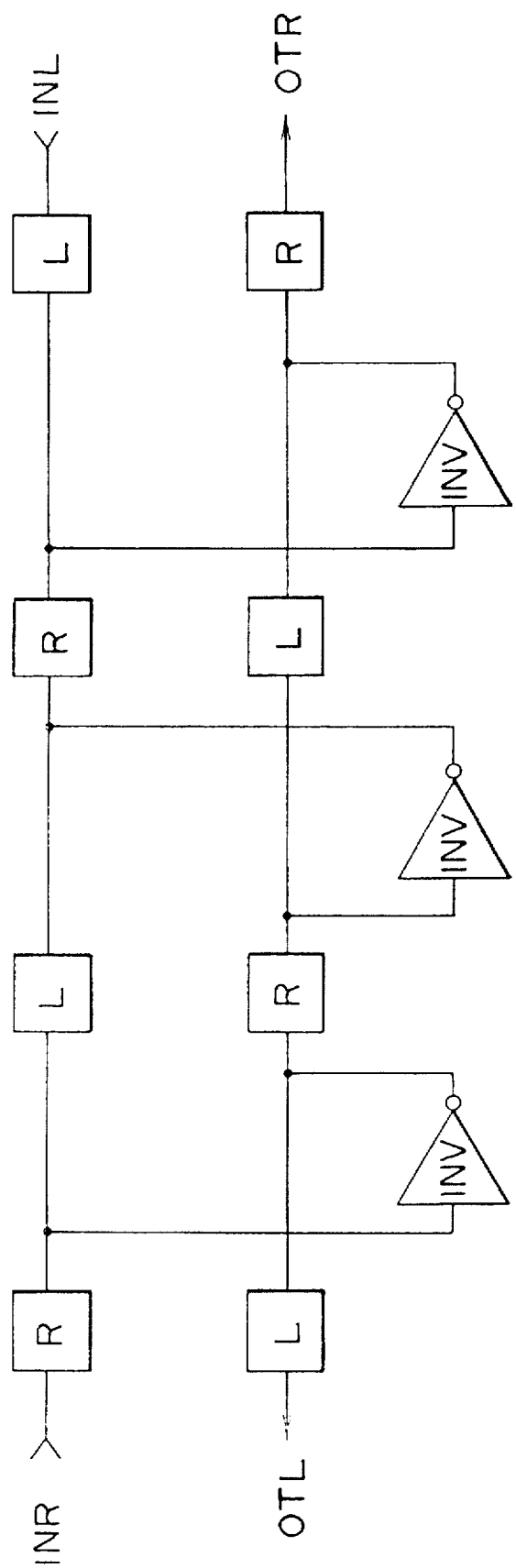
FIG. 4 is a block diagram showing a bidirectional signal transmission network to which the present invention is applied.

While, in the embodiments described above, a shift register wherein flipflops are connected in multiple stages is described as a signal transmission block, the present invention can be applied to any ordinary bidirectional signal transmission network. A generalized bidirectional signal transmission network has a multi-stage structure which includes a plurality of signal transmission blocks each having an input terminal of a comparatively high impedance and an output terminal of a comparatively low impedance and wherein the input and output terminals are successively connected. A forward route gate element is interposed in a connection route between the front stage side output terminal and the rear stage side input terminal of each adjacent front and rear ones of the signal transmission blocks. Meanwhile, a reverse route gate element is interposed in another connection route between the rear stage side output terminal and the front stage side input terminal. The forward route gate elements and the reverse route gate elements can be alternatively controlled to open or close to switchably select forward direction signal transfer processing and reverse direction signal transfer processing. FIG. 4 shows, as another example of such bidirectional signal transmission network, a bidirectional signal delay network wherein invertors are connected in multiple stages. Referring to FIG. 4, a forward direction input signal INR is processed by delaying processing at multiple stages by way of forward route gate elements R and invertors INV so that a forward direction output signal OTR is obtained. On the other hand, a reverse direction input signal INL is similarly processed by multistage delaying processing by way of reverse route gate elements L and the invertors INV so that a reverse direction output signal OTL is obtained.

Figure 5:
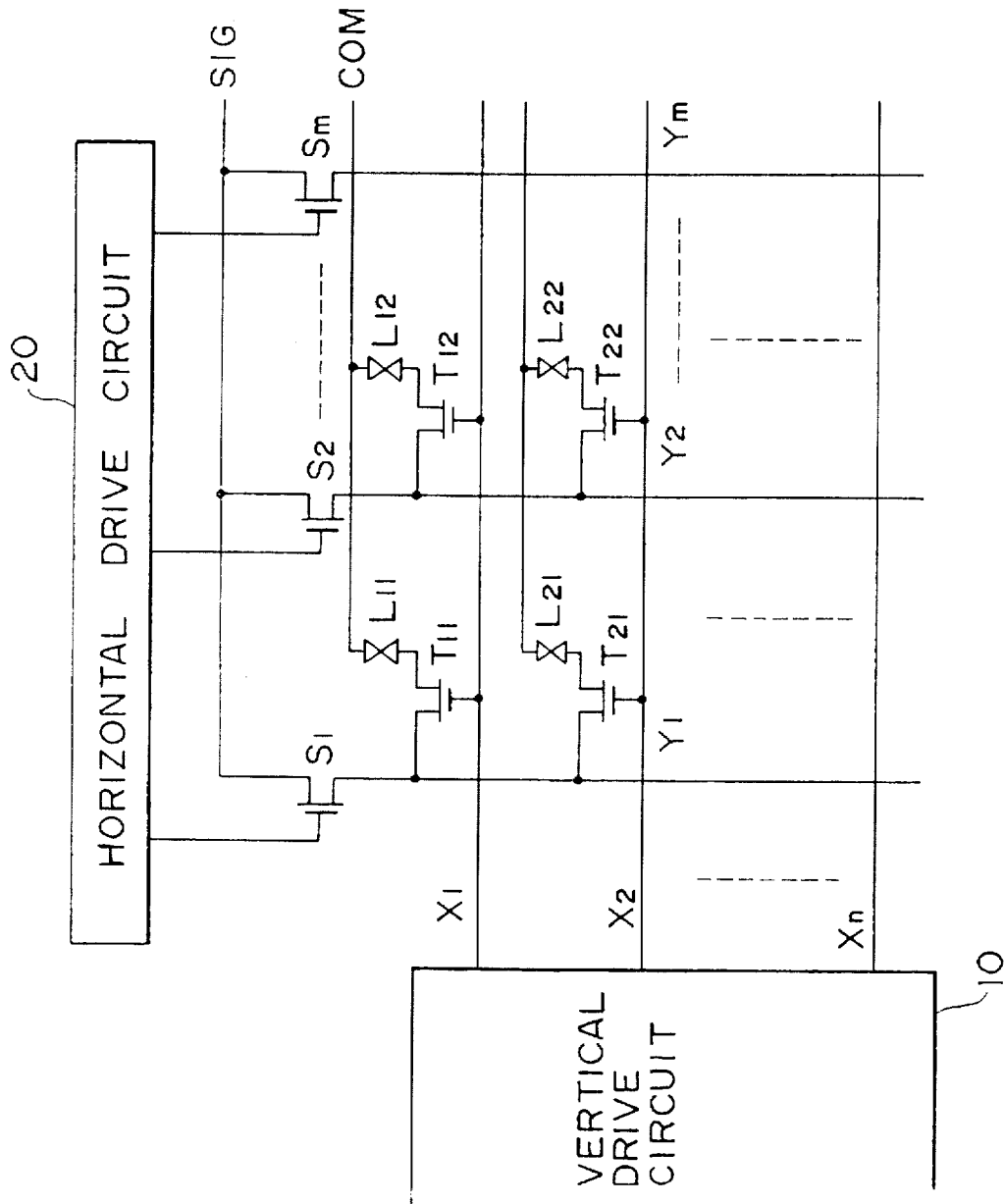
FIG. 5 is a schematic circuit diagram an active matrix liquid crystal display device in which a bidirectional signal transfer shift register according to the present invention is incorporated.
Figure 6:
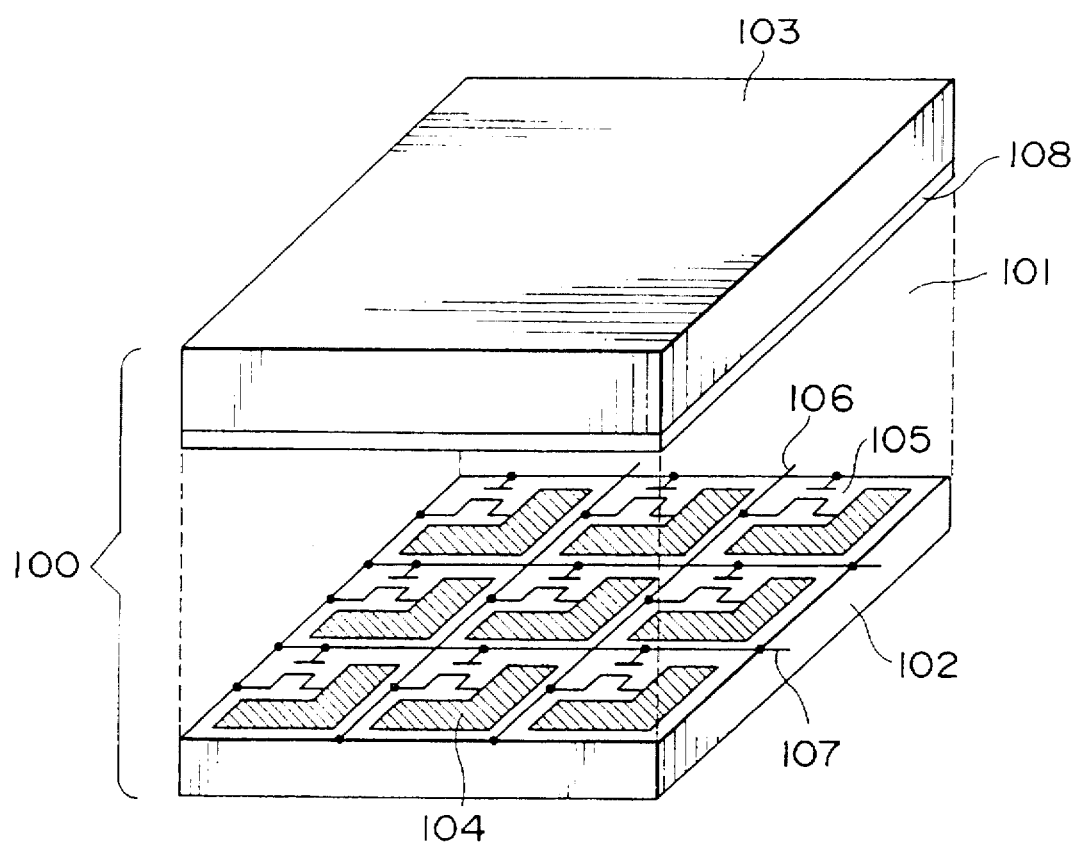
FIG. 6 is a schematic perspective view showing a general construction of an active matrix liquid crystal display device.
Figure 7:
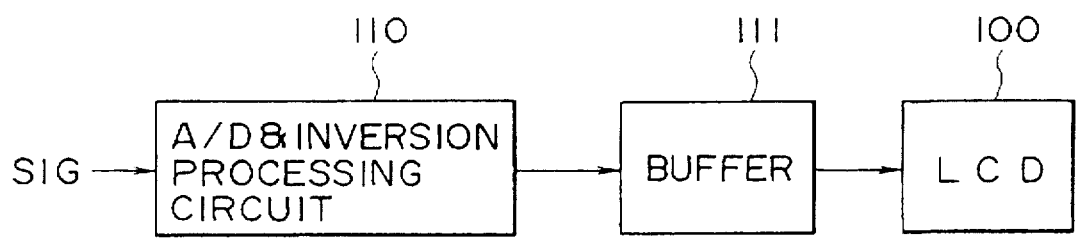
FIG. 7 is a block diagram showing an exemplary one of conventional image reversing systems.
Figure 8:
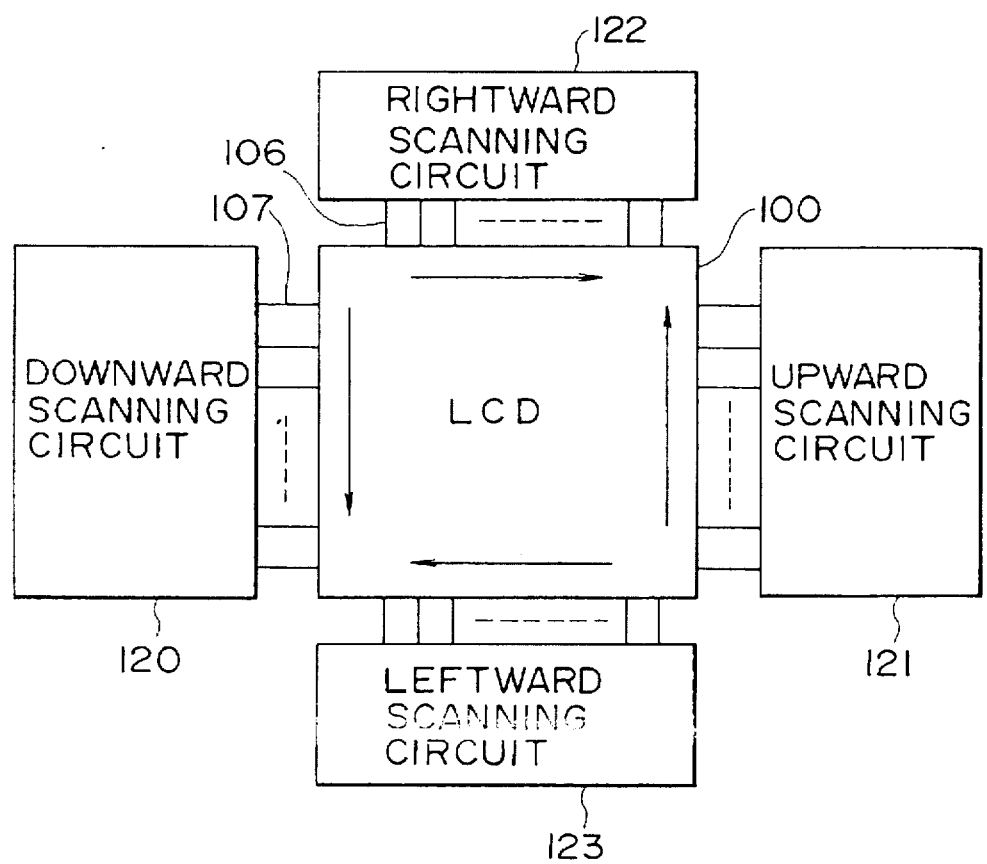
FIG. 8 is a block diagram showing another conventional image reversing system.

Finally, an active matrix liquid crystal display device to which the present invention is applied will be described in detail with reference to FIG. 5. The active matrix liquid crystal display device has a flat panel structure which includes a pair of substrates disposed in an opposing relationship to each other with a predetermined gap left therebetween, and a liquid crystal layer held in the gap. Formed on one of the substrates are n gate lines $X_1, X_2, \ldots,$ $X_n$ disposed along the direction of a row of a matrix, m data lines $Y_1, Y_2, \ldots, Y_m$ disposed along the direction of a column of the matrix, active elements $T_{11}, T_{12}, T_{21}, T_{22}, \ldots$ from thin film transistors and positioned at crossing points of the gate lines and the data lines, picture element electrodes driven by the individual active elements, a vertical drive circuit 10 for line-sequentially supplying a gate signal to the gate lines $X_1, X_2, \ldots, X_n$, and a horizontal drive circuit 20 for line-sequentially supplying a data signal SIG to the data lines $Y_1, Y_2, \ldots, Y_m$ by way of switching elements $S_1$, $S_2, \ldots, S_m$. A plurality of opposing electrodes COM are formed on the other substrate and construct liquid crystal picture elements $L_{11}, L_{12}, L_{21}, L_{22}, \ldots$ together with the individual picture element electrodes to form a desired image in response to potential differences from the picture element electrodes. In the construction described above, at least one of the vertical drive circuit 10 and the horizontal drive circuit 20 includes a bidirectional shift register which can switchably control the line sequential supplying order of a signal between the two forward and reverse directions so that reversal display of an image may be performed selectively. Where the vertical drive circuit 10 includes a bidirectional shift register, vertically reversed display of an image is allowed selectively. In particular, when a gate signal is successively supplied beginning with the gate line X1 and ending with the gate line Xn by the vertical drive circuit 10, a normal or non-reversed display is obtained, but on the contrary when a gate signal is successively supplied beginning with the gate line Xn and ending with the gate line X1, a vertically reversed display is obtained. Similarly, where the horizontal drive circuit 20 includes a bidirectional shift register, leftwardly and rightwardly reversed display of an image is allowed selectively. In particular, when the switching elements S1 to Sm are scanned in the direction from switching element S1 toward the switching element Sm by the horizontal drive circuit 20, a normal or non-reversed display can be obtained. On the contrary, when the switching elements S1 to Sm are scanned from the switching element Sm toward the switching element S1, a leftwardly and rightwardly reversed display can be obtained.

Having now fully described the invention, it will be apparent to one of ordinary skill in the art that many changes and modifications can be made thereto without departing from the spirit and scope of the invention as set forth herein.

What is claimed is:

1. An arrangement for preparing image data for display, comprising:

means for selectively implementing a reflection reversal of the image data, including:

a plurality of signal transmission blocks each having an input terminal of a comparatively high impedance and an output terminal of a comparatively low impedance, the input and output terminals of said signal transmission blocks being connected successively;

a forward route switch element interposed in a connection route between the output terminal of the front stage side one of each two adjacent front and rear ones of said signal transmission blocks and the input terminal of the rear stage side signal transmission block, said forward route switch selectively transmitting image data, said forward route switch remaining in one of an open position and a closed position during data transmission;

a reverse route switch element interposed in another connection route between the output terminal of the rear stage side one of each two adjacent front and rear ones of said signal transmission blocks and the input terminal of the front stage side signal transmission block, said reverse route switch selectively transmittting image data, said reverse route switch remaining in one of an open position and a closed position during data transmission;

said connection route and said another connection route being parallel to one another, and said forward route switch element and said reverse route switch element alternating in said connection routes, and control means for alternatively controlling the forward route switch elements and the reverse route switch elements to open or close to switchably select forward direction signal transmission processing from the front stage side signal transmission blocks to the rear stage side signal transmission blocks and reverse direction signal transmission processing from the rear stage side signal transmission blocks to the front stage side signal transmission blocks, only a single one of said forward route switch elements being connected between each pair of adjacent ones of said signal transmission blocks during forward direction signal transmission processing and only a single one of said reverse route switch elements being connected between each pair of adjacent ones of said signal transmission blocks during reverse direction signal transmission processing.

2. An image reversal apparatus, comprising:

means for at least one of reversing and inverting image data for display, including:

a bidirectional signal transfer shift register having:

a plurality of flipflops each having an input terminal and an output terminal in pair, the input and output terminals of said flipflops being connected successively in such a manner as to construct a multistage structure;

a forward route switch element interposed in a connection route between the output terminal of the front stage side one of each two adjacent front and rear ones of said flipflops and the input terminal of the rear stage side flipflops, said forward route switch element being switchable from a transmitting to a non-transmitting state by control signals that remain in a state determinative of switching direction without change at each clock signal;

a reverse route switch element interposed in another connection route between the output terminal of the rear stage side one of each two adjacent front and rear ones of said flip flops and the input terminal of the front stage side flipflop, said reverse route switch element being switchable from a transmitting to a non-transmitting state by control signals that remain in a state determinative of switching direction without change at each clock signal; and said connection route and said another connection route being parallel to one another, said forward route switch element and said reverse route switch element alternating in said connection routes, only a single one of said forward route switch elements being connected between each pair of adjacent ones of said flip-flops during forward direction signal transmission processing and only a single one of said reverse route switch elements being connected between each pair of adjacent ones of said flip-flops during reverse direction signal transmission processing.

3. An active matrix liquid crystal display device for selective projection in one of a plurality of orientations, comprising:

means for selectively reversing orientation of an image signal depending on projection orientation, including:

a first substrate on which a plurality of gate lines disposed along the direction of a row of a matrix, a plurality of data lines disposed along the direction of a column of the matrix, a plurality of active elements positioned at crossing points between said gate lines and said data lines, a plurality of picture element electrodes individually driven by said active elements, a vertical drive circuit for supplying a gate signal line-sequentially to said gate lines, and a horizontal drive circuit for supplying a data signal line-sequentially to said data lines are formed;

a second substrate disposed in an opposing relationship to said first substrate and having a plurality of opposing electrodes formed thereon;

a liquid crystal layer held in a gap between said first and second substrates; and a bidirectional shift register capable of switchably controlling the line sequential supplying order of the gate signal or the data signal between two forward and reverse directions, said bidirectional signal transfer shift register having:

a plurality of flipflops each having an input terminal and an output terminal in pair, the input and output terminals of said flipflops being connected successively in such a manner as to construct a multistage structure;

a forward route switch element interposed in a connection route between the output terminal of the front stage side one of each two adjacent front and rear ones of said flipflops and the input terminal of the rear stage side flipflops, said forward route switch element being switchable from a transmitting to a non-transmitting state by control signals that remain in a state determinative of switching direction without change at each clock signal;

a reverse route switch element interposed in another connection route between the output terminal of the rear stage side one of each two adjacent front and rear ones of said flip flops and the input terminal of the front stage side flipflop, said reverse route switch element being switchable from a transmitting to a non-transmitting state by control signals that remain in a state determinative of switching direction without change at each clock signal, only a single one of said forward route switch elements being connected between each pair of adjacent ones of said flip-flops during forward direction signal transmission processing and only a single one of said reverse route switch elements being connected between each pair of adjacent ones of said flip-flops during reverse direction signal transmission processing.

4. An active matrix liquid crystal display device according to claim 3, wherein said bidirectional shift register is included in said vertical drive circuit so as to selectively allow vertically reversed display of an image.

5. An active matrix liquid crystal display device according to claim 3, wherein said bidirectional shift register is included in said horizontal drive circuit so as to selectively allow leftwardly and rightwardly reversed display of an image.

6. An active matrix liquid crystal display device according to claim 3, wherein said bidirectional shift register includes a plurality of flipflops each having an input terminal and an output terminal in pair, the input and output terminals of said flipflops being connected successively in such a manner as to construct a multi-stage structure.

7. An active matrix liquid crystal display device according to claim 6, wherein said bidirectional shift register further includes a forward route gate element interposed in a connection route between the output terminal of the front stage side one of each two adjacent front and rear ones of said flipflops and the input terminal of the rear stage side flipflop, and a reverse route gate element interposed in another connection route between the output terminal of the rear stage side one of each two adjacent front and rear ones of said flipflops and the input terminal of the front stage side flipflop, the forward route gate elements and the reverse route gate elements being alternatively controlled to open or close to switchably select forward direction signal transfer from the front stage side flipflops to the rear stage side flipflops and reverse direction signal transfer from the rear stage side flipflops to the front stage side flipflops.

8. In a display having a selectable image orientation, a two-dimensional address device which includes a row scanning line group, a column scanning line group, and a group of active elements disposed corresponding to individual crossing points between the two scanning line groups, comprising:

a drive circuit connected to at least one of the scanning line groups for successively supplying a drive signal to the scanning line group, said drive circuit including a plurality of signal transmission blocks each having an input terminal and an output terminal, the input and output terminals of said signal transmission blocks being connected successively, the output terminals of said signal transmission blocks being individually connected to corresponding scanning lines of the one scanning line group;

a forward route switch element interposed in a connection route between the output terminal of the front stage side one of each two adjacent front and rear ones of said signal transmission blocks and the input terminal of the rear stage side signal transmission block; and a reverse route switch element interposed in another connection route between the output terminal of the rear stage side one of each two adjacent front and rear ones of said signal transmission blocks and the input terminal of the front stage side signal transmission block;

the forward route switch elements and the reverse route switch elements are alternatively controlled to open or close under control of a control signal which does not change at each clock signal to switchably select forward direction signal transmission processing from the front stage side signal transmission blocks to the rear stage side signal transmission blocks and reverse direction signal transmission processing from the rear stage side signal transmission blocks to the front stage side signal transmission blocks, only a single one of said forward route switch elements being connected between each pair of adjacent ones of said signal transmission blocks during forward direction signal transmission processing and only a single one of said reverse route switch elements being connected between each pair of adjacent ones of said signal transmission blocks during reverse direction signal transmission processing.

* * * * *